US010250029B2

(12) United States Patent
Carletti et al.

(10) Patent No.: US 10,250,029 B2
(45) Date of Patent: Apr. 2, 2019

(54) DEVICE OVERVOLTAGE DETECTOR

(71) Applicant: Infineon Technologies AG, Neubiberg (DE)

(72) Inventors: Andrea Carletti, Munich (DE); Gerold Schrittesser, Keostenberg (AT); Albino Pidutti, Villach (AT)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 15/160,610

(22) Filed: May 20, 2016

(65) Prior Publication Data
US 2017/0338648 A1 Nov. 23, 2017

(51) Int. Cl.
| H02H 5/04 | (2006.01) |
| H02H 7/20 | (2006.01) |
| H01L 23/525 | (2006.01) |
| H01L 27/02 | (2006.01) |
| H01L 29/866 | (2006.01) |
| H02H 3/20 | (2006.01) |
| H01L 23/495 | (2006.01) |

(52) U.S. Cl.
CPC .......... *H02H 7/205* (2013.01); *H01L 23/5256* (2013.01); *H01L 27/0255* (2013.01); *H01L 27/0288* (2013.01); *H01L 29/866* (2013.01); *H02H 3/20* (2013.01); *H01L 23/49562* (2013.01); *H01L 2224/0603* (2013.01); *H01L 2224/48247* (2013.01); *H01L 2224/48465* (2013.01); *H01L 2224/4903* (2013.01)

(58) Field of Classification Search
USPC .......................................... 327/525; 361/104
See application file for complete search history.

(56) References Cited

U.S. PATENT DOCUMENTS

| 3,700,969 | A | * | 10/1972 | Furnival | H01L 23/34 257/665 |
| 3,737,725 | A | * | 6/1973 | Donnelly | H02H 9/042 361/56 |
| 4,845,476 | A | * | 7/1989 | Rangeard | G01V 3/088 340/657 |
| 6,072,691 | A | * | 6/2000 | Suhara | H01G 9/155 307/109 |
| 2002/0039270 | A1 | * | 4/2002 | Sato | H02H 9/042 361/93.1 |

(Continued)

FOREIGN PATENT DOCUMENTS

| JP | H02253651 A | 10/1990 |
| JP | 2007129044 A | 5/2007 |

OTHER PUBLICATIONS

English Machine Translation of the Description of Applicant submitted JP2007129044. Pub. May 24, 2007.*

(Continued)

*Primary Examiner* — Ronald W Leja
(74) *Attorney, Agent, or Firm* — Shumaker & Sieffert, P.A.

(57) ABSTRACT

A semiconductor device, overvoltage detection structure is described that includes a current path including a Zener diode connected in series with a fuse. The Zener diode is configured to conduct a current in response to an overvoltage condition at a semiconductor device and the fuse is configured to permanently break the current path of the overvoltage detection structure in response to the Zener diode conducting the current.

20 Claims, 7 Drawing Sheets

(56) References Cited

U.S. PATENT DOCUMENTS

| | | | | |
|---|---|---|---|---|
| 2006/0083031 | A1* | 4/2006 | Cook | H02M 1/32 |
| | | | | 363/20 |
| 2006/0278932 | A1* | 12/2006 | Kothandaraman | |
| | | | | H01L 23/5256 |
| | | | | 257/368 |
| 2009/0195256 | A1* | 8/2009 | Meagher | G05B 9/02 |
| | | | | 324/537 |
| 2010/0090751 | A1 | 4/2010 | Cheng et al. | |
| 2017/0338648 | A1* | 11/2017 | Carletti | H01L 23/5256 |

OTHER PUBLICATIONS

"Insulated-gate bipolar transistor," Wikipedia, the free encyclopedia, retrieved from https://en.wikipedia.org/w/index.php?title=Insulated-gate_bipolar_transistor&oldid=718621333, May 4, 2016, 4 pp.

"Density of the elements," retrieved from http://periodictable.com/Properties/A/Density.al.html on May 20, 2016, 2 pp.

"Zener diode," Wikipedia, the free encyclopedia, retrieved from https://en.wikipedia.org/w/index.php?title=Zener_diode&oldid=720761713, May 17, 2016, 7 pp.

"MOSFET," Wikipedia, the free encyclopedia, retrieved from https://en.wikipedia.org/w/index.php?title=MOSFET&oldid=720686596, May 17, 2016, 27 pp.

Office Action, in the German language, from counterpart German Application No. 102017110869.6, dated Jan. 17, 2018, 6 pp.

\* cited by examiner

DEVICE OVERVOLTAGE DETECTOR

TECHNICAL FIELD

The following disclosure relates to semiconductor device overvoltage detection.

BACKGROUND

Semiconductor devices, such as power metal-oxide-semiconductor field-effect transistors (MOSFETs), insulated-gate bipolar transistors (IGBTs), and other such devices including diodes, are sometimes used in stressful applications that exceed the maximum operating requirements imposed by a device manufacturer. For example, as a way to reduce cost, a lower-rated (and typically cheaper) semiconductor device component may be used in a system that regularly exceeds the maximum rating of the component. A stressful operating environment may damage or degrade the component and may eventually cause the component to permanently fail. When a component fails, the failed component may undergo failure analysis.

In order to adequately perform analysis of a failed or damaged component, it may be desirable to understand the operating conditions of the component from the time leading up to, and during a failure. For example, one of the most common stress conditions that may lead to a failed semiconductor device is an overvoltage that exceeds the maximum rated voltage of the device (e.g., between the Drain and Source or Collector and Emitter) and causes a junction of the device to break down. While sonic components can often withstand the high power dissipation that may occur as a result of such an overvoltage condition for a short amount of time, eventually prolonged or repeated exposure to an overvoltage may cause permanent damage (e.g., according to the Wunsch-Bell breakdown characteristic of the device). When a device is undergoing failure analysis, it may not always be clear from visual inspection and/or other evidence about its failure, whether such an overvoltage occurred, which may result in an improper or misdiagnosed failure.

SUMMARY

In general, circuits and techniques are described for providing a semiconductor device with an overvoltage detection system that permanently changes states when an overvoltage event occurs. The state change that occurs in response to an overvoltage event may be observable via visual inspection of the semiconductor device, whether or not failure of the semiconductor occurs.

In one example, the disclosure is directed to semiconductor component that includes a device, and an overvoltage detection structure that includes a current path comprising a Zener diode connected in series with a fuse. The Zener diode is configured to conduct a current in response to an overvoltage condition at the device, and the fuse is configured to break the current path of the overvoltage detection structure in response to the Zener diode conducting the current.

In another example, the disclosure is directed to semiconductor die that includes a device, and at least a portion of an overvoltage detection structure that includes a current path comprising a Zener diode connected in series with a fuse. The Zener diode is configured to conduct a current in response to an overvoltage condition at the device, and the fuse is configured to break the current path of the overvoltage detection structure in response to the Zener diode conducting the current.

In another example, the disclosure is directed to a method that includes responsive to an overvoltage condition at a device, conducting, by a Zener diode of an overvoltage detection structure, a current through a current path formed by a series connection between a fuse and the Zener diode of the overvoltage detection structure, and responsive to conducting the current through the current path, breaking, by the fuse of the overvoltage detection structure, the current path.

The details of one or more examples are set forth in the accompanying drawings and the description below. Other features, objects, and advantages of the disclosure will be apparent from the description and drawings, and from the claims.

DETAILED DESCRIPTION

In general, circuits and techniques are described for providing a semiconductor component with an overvoltage detection system that permanently changes states when an overvoltage event occurs. The state change that occurs in response to an overvoltage event may be observable via visual inspection of the semiconductor component, whether or not failure of the semiconductor occurs.

For example, a semiconductor component may include an overvoltage detection system as an integrated structure made up of a Zener diode in series with a fuse. The Zener diode may provide a current path to the fuse only when an overvoltage across the drain and source terminals or across the collector and emitter terminals or across the anode and cathode terminals of the semiconductor component occurs. The current that reaches the fuse may cause the fuse to burn and break, thereby permanently storing an indication that an overvoltage event that may lead to stress or failure, has occurred. In some examples, the fuse may be made from a material that causes a break in the fuse to be clearly visible during an x-ray inspection.

Due at least in part to its design, the overall cost to integrate such an overvoltage detection system into a semiconductor component may be minimal, allowing affordable failure analysis due to overvoltage to be performed from anywhere that x-ray inspection is available. In this way, customers and manufacturers of semiconductor components alike can cheaply and quickly determine whether a component has ever been exposed to an overvoltage event at any point in its life, regardless whether the overvoltage event actually caused the component to fail. Since the fuse may only ever break because of an overvoltage condition, a determination as to whether an overvoltage event occurred can be made with near certainty, which may allow an investigator to understand the operating environment in which a component may have failed.

Figure 1:
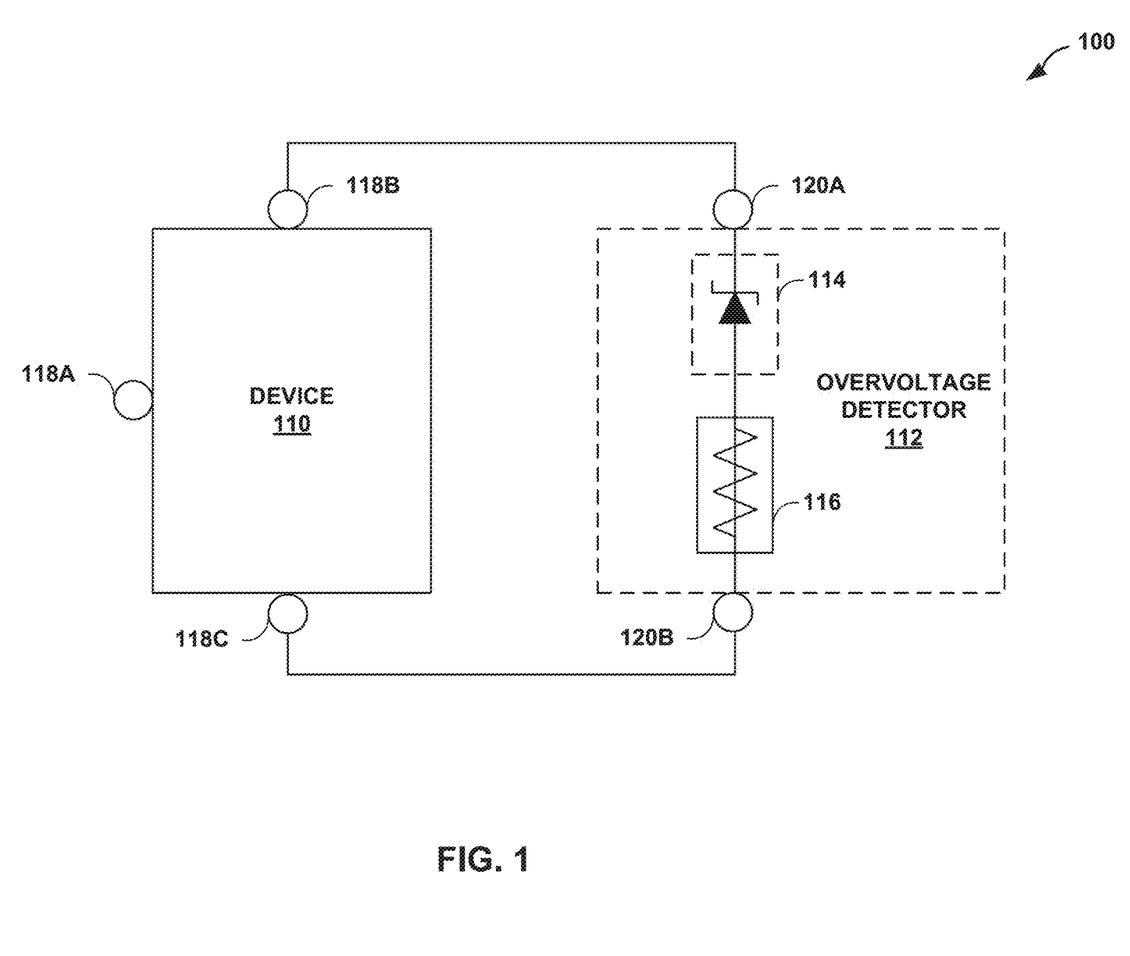
FIG. 1 is a conceptual diagram illustrating an example system that includes an example overvoltage detection system configured to permanently change states when an overvoltage event occurs, in accordance with one or more aspects of the present disclosure.

FIG. 1 is a conceptual diagram illustrating an example system that includes an example overvoltage detection system configured to permanently change states when an overvoltage event occurs, in accordance with one or more aspects of the present disclosure. System 100 includes device 110 and overvoltage detector 112. Over voltage detector 112 includes Zener diode 114 and fuse 116.

System 100 may form part or all of various types of electronic and computing devices. Many applications for system 100 exist and include, but are not limited to, power systems, computing systems, automotive systems, other transportation systems, communication systems, and any other electronic system that relies on semiconductor devices that may fail or experience stress from overvoltage events.

In some examples, system 100 is a single semiconductor component. In other examples, system 100 may include more than one semiconductor component. Device 110 and overvoltage detector 112 may be formed on a single semiconductor die or body of system 100. And in other examples, device 110 and a portion of overvoltage detector 112 may be formed on one semiconductor die or body of system 100 while a remaining portion of overvoltage detector 112 may be formed on a different semiconductor die or body.

Device 110 represents any type of semiconductor device that may fail or experience stress from overvoltage events. In some examples, device 110 represents a power metal-oxide-semiconductor field-effect transistor (MOSFET) and in other examples, device 110 is an insulated-gate bipolar transistors (IGBT). Device 110 may be formed of various material compounds, such as silicon (Si), silicon carbide (SiC), Gallium Nitride (GaN), or any other combination of one or more semiconductor materials.

Device 110 includes terminals 118A, 118B, and 118O (collectively referred to herein as "terminals 118"). In cases where device 110 is an IGBT, terminal 118A may be a gate terminal of device 110 and terminals 118B and 118O may be the collector and emitter terminals of device 110. In some examples where device 110 is an IGBT, terminal 118B may be the collector terminal of device 110 and terminal 118C may be the emitter terminal of device 110, whereas in other examples, terminal 118B may be the emitter terminal of device 110 and terminal 118O may be the collector.

In other cases where device 110 is a MOSFET, terminal 118A may be a gate terminal of device 110 and terminals 118B and 118O may be the source and drain terminals of device 110. In some examples where device 110 is a MOSFET, terminal 118B may be the source terminal of device 110 and terminal 118C may be the gate terminal of device 110, whereas in other examples, terminal 118B may be the gate terminal of device 110 and terminal 118C may be the source.

Overvoltage detector 112 represents an overvoltage detection structure that includes a current path formed from Zener diode 114 connected in series with fuse 116. Overvoltage detector 112 represents an overvoltage detection structure that is formed, at least partially, on the same semiconductor die as device 110.

As is described in greater detail below with respect to the additional FIGS., overvoltage detector 112 may be at least partially integrated on the same semiconductor die as device 110. Although fuse 116 of overvoltage detector 112 is shown in FIG. 1 as following Zener diode 114, in other examples, Zener diode 114 may follow fuse 116.

Zener diode 114 is configured to perform the function of providing current to fuse 116 only in case of a drain/source or emitter/collector overvoltage condition at device 110 and the polarity of Zener diode 114 may depend on the current direction in avalanche mode. Fuse 116 is configured to perform the function of burning in order to permanently store an indication that an overvoltage or "overstress" event occurred. Fuse 116 may be made of a material that enables a break in the material to be visible via x-Ray (or visual inspection under some other light spectrum inspection that is different from the light spectrum in which some other components of systems 100 is visible) thereby enabling the break to be recognizable under X-Ray and without further damaging or removing device 110 from its overall system (e.g., a PCB board or other circuit or housing). Fuse 116 protects and prevents Zener diode 114 from being damaged due to overvoltage conditions. In particular, fuse 116 may protect Zener diode 114 from overvoltage conditions in order to prevent any possibility of the overstress detector from influencing the behavior of the device (e.g., MOSFET, IGBT, etc.) during normal operation.

Overvoltage detector 112 is electrically coupled to terminals 118B and 118C of device 110, which configures overvoltage detector 112 to permanently change states when an overvoltage event occurs between terminals 118B and 118C of device 110. Zener diode 114 is configured to conduct a current in response to an overvoltage condition at the device and fuse 116 is configured to break the current path of overvoltage detector 112 in response to Zener diode 114 conducting the current.

In other words, if a voltage appears across terminals 118B and 118C that exceeds the voltage rating of device 110 or otherwise triggers Zener diode 115 to begin conducting, fuse 116 may permanently "break", thereby recording an observable indication that the overvoltage event occurred. In some examples, the break in fuse 116 may be observable via X-ray, well after the overvoltage event has occurred, so as to provide evidence that overvoltage event actually occurred.

Overvoltage detector 112 includes terminals 120A and 120B. As shown in FIG. terminal 120A is coupled to Zener diode 114 and terminal 118B of device 110 and terminal 120B is coupled to fuse 116 and terminal 118C of device 110. Zener diode 114 and fuse 116 share a common connection that is not at either of terminals 120A or 120B. In sonic examples, the orientation of overvoltage detector 112 shown in FIG. 1 may be flipped such that terminal 120A of device 110 is coupled to Zener diode 114 and terminal 118C of device 110 and terminal 120B of device 110 is coupled to fuse 116 and terminal 118B of device 110.

Overvoltage detector 112 may be configured to detect the voltage between terminals 118B and 118O of device 110, regardless as to which terminals 118B and. 118C represent the source and drain terminals or emitter and collector terminals. For example, overvoltage detector 112 may detect the voltage of device 110 as a source and drain voltage ($V_{DS}$), a drain and source voltage ($V_{SD}$), a collector and emitter voltage ($V_{CE}$), or a emitter and collector voltage ($V_{EC}$). In other words, in some examples, the drain of device 110 may be coupled to Zener diode 114 of overvoltage detector 112 and the source of device 110 may be coupled to fuse 116 of overvoltage detector 112. And in other examples, the source of device 110 may be coupled to Zener diode 114 of overvoltage detector 112 and the drain of device 110 may be coupled to fuse 116 of overvoltage detector 112. In other examples, the collector of device 110 may be coupled to Zener diode 114 of overvoltage detector 112 and the emitter of device 110 may be coupled to fuse 116 of overvoltage detector 112. And in other examples, the emitter of device 110 may be coupled to Zener diode 114 of overvoltage detector 112 and the collector of device 110 may be coupled to fuse 116 of overvoltage detector 112.

Figure 2:
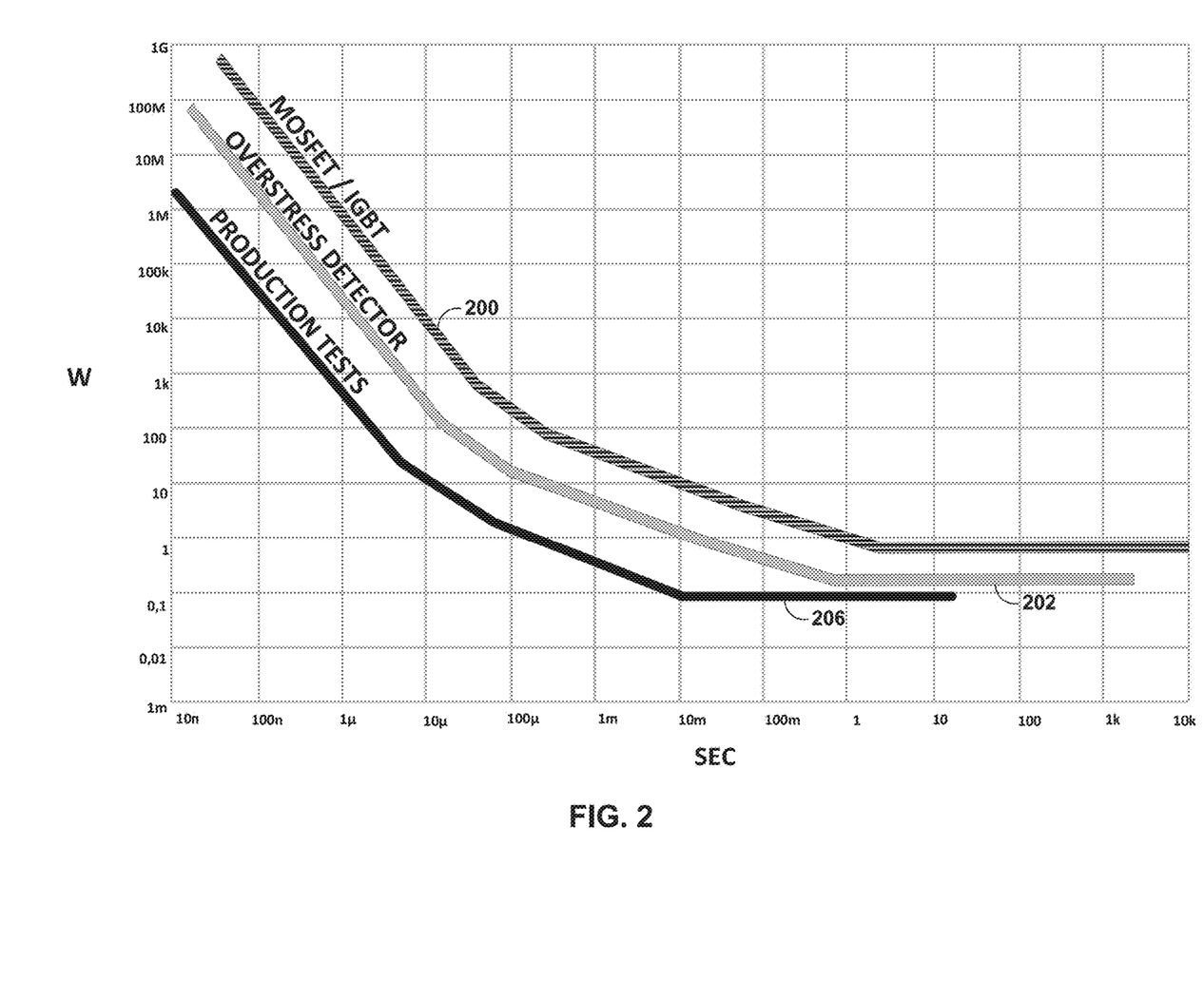
FIG. 2 is graph illustrating example Wunsch Bell characteristics of various components of the example system of FIG. 1.

FIG. 2 is graph illustrating example Wunsch Bell characteristics of various components of the example system of FIG. 1. FIG. 2 is described in the context of system 100 of FIG. 1. Wunsch Bell characteristics are based on the theory that high-amplitude, short-duration transient pulses may cause the destruction of an electronic component and the amount of damage caused to a semiconductor device due to a transient pulse or overvoltage condition, can be predicted using the Wunsch Bell electrical overstress model. According to the model, along with the peak voltage and current incurred in a device, the pulse duration of an overvoltage condition is important in determining the amount of power required to cause a bipolar junction to fail.

FIG. 2 shows the Wunsch Bell characteristics of device 110 and overvoltage detector 112 at their respective breakdown voltages in relation to Wunsch Bell characteristics of production tests of device 110. FIG. 2 shows that overvoltage detector 112 may need have a sufficiently high voltage and power rating to be able to withstand, and not be damaged from, the voltages and associated power levels that device 110 may be exposed to during a production or manufacturing test so as to remain intact after the production testing process. FIG. 2 also shows that overvoltage detector 112 may need have a sufficiently high voltage and power rating that makes overvoltage detector 112 more robust, at the breakdown voltage than, the absolute maximum rating of device 110 to which overvoltage detector 112 belongs. In other words, overvoltage detector 112 may need fuse 116 to remain intact and not break during production testing and may further need fuse 116 to burn and break before or at the same time that an overvoltage condition at device 110 causes device 110 to fail. Zener diode 114 may be selected to have a particular breakdown voltage $V_Z$, the value of which may be depend on and not be too different from, the breakdown voltage $V_D$ of device 110 at terminals 118B and 118C.

In some examples, a breakdown voltage $V_Z$ of Zener diode 114 is equal to a breakdown voltage $V_D$ of device 110. For example, device 110 may be a MOSFET and have a rating $V_{DS/CE\_AMR}$ of 40V. The drain source breakdown voltage $V_{DS\_BREAKDOWN}$ of device 110 may be 55V. Under those conditions, device 110 may be rated to withstand a maximum of 1 A for a short amount of time and according to its Wunsch Bell characteristic causing device 110 to therefore have a maximum current rating of approximately 0.8 A.

So as to adequately detect and record when an overvoltage condition occurs at device 110, overvoltage detector 112 may need to be weaker than device 110 so that fuse 116, while also being sufficiently strong to survive production tests, is damaged either just before or at the same time that device 110 is damaged during over voltages. Accordingly, Zener diode 114 may have a breakdown voltage $V_Z$ of 55V so as to equal the breakdown voltage $V_{DS\_BREAKDOWN}$ of device 110.

Zener diode 114 may have an area size that is smaller than the total area of device 110 and conduct a proportionate amount of current as compared to the current being conducted by device 110. For example, the size of area occupied by Zener diode 114 may be one hundredth the size of the area of device 110 so that when Zener diode 114 is in avalanche mode. Zener diode 114 may conduct approximately one hundredth the current of device 110. In this example, fuse 116 may be sized to handle a current of no more than 8 mA so that fuse 116 will burn and break and permanently store an indication of the voltage overstress event when Zener diode 114 conducts current in avalanche mode that exceeds the current rating of device 110.

In some examples, a breakdown voltage $V_Z$ of Zener diode 114 is greater than a breakdown voltage $V_D$ of device 110, for instance, to record when device 110 is exposed to overvoltage conditions or high currents that far exceed the voltage and current ratings of device 110. For instance, the breakdown voltage $V_Z$ of Zener diode 114 may be greater than a breakdown voltage $V_D$ of device 110 so that Zener diode 114 automatically conducts current when the current in device 110 reaches a defined threshold that in some examples may be greater than the maximum current rating of device 110.

In some examples, a breakdown voltage $V_Z$ of Zener diode 114 is less than a breakdown voltage $V_D$ of device 110. For example, in sonic applications, device 110 cannot work in avalanche mode and instances during which the voltage at device 110 exceeds $V_{DS\_BREAKDOWN}$ may still need to be detected. Zener diode 114 may have a breakdown voltage Vz that is lower than $V_{DS\_BREAKDOWN}$ of device 110 and closer to, or equal to, the rating $V_{DS/CE\_AMR}$ of device 110 (e.g., in this example is 40V) and fuse 116 may have an internal resistance calculated to cause fuse 116 to break down at the desired voltage, the in this example is 55V.

Figure 3:
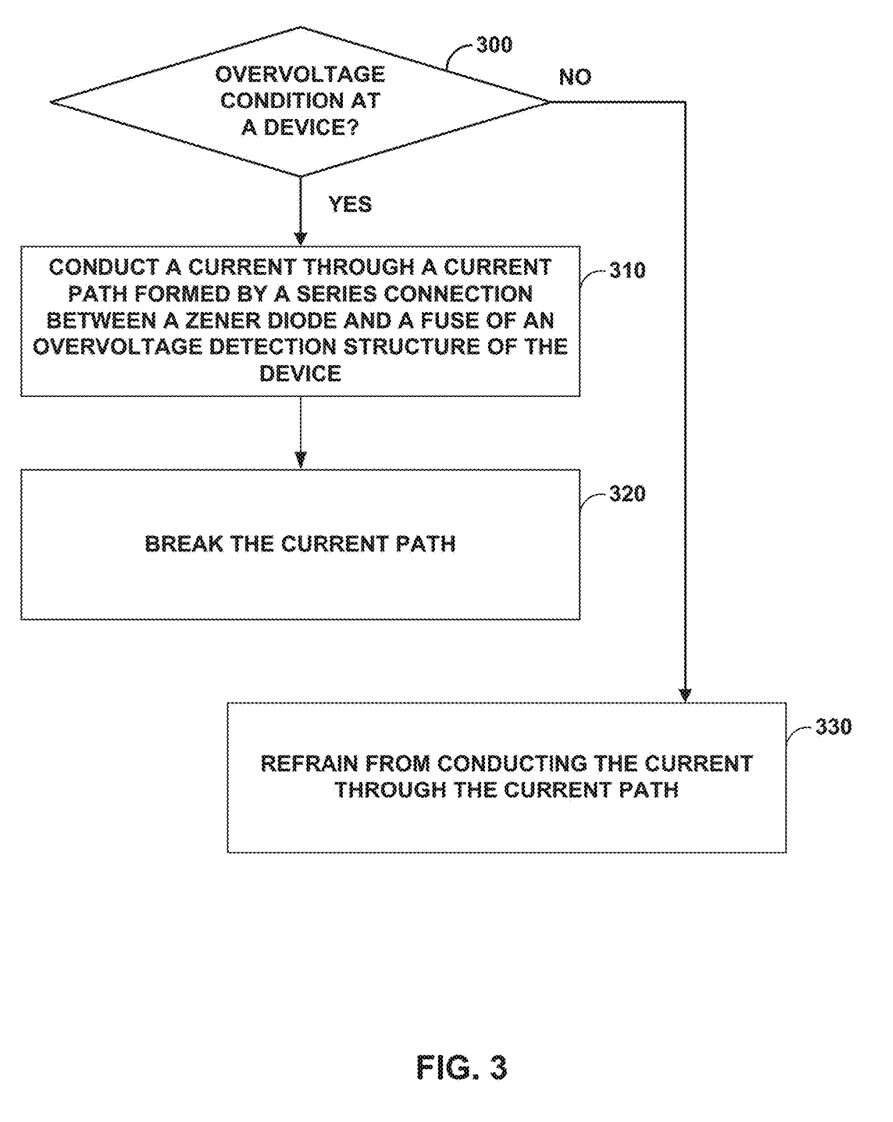
FIG. 3 is a flow chart illustrating operations performed by an example overvoltage detection system configured to permanently change states when an overvoltage event occurs, in accordance with one or more aspects of the present disclosure.

FIG. 3 is a flow chart illustrating operations performed by an example overvoltage detection system configured to permanently change states when an overvoltage event occurs, in accordance with one or more aspects of the present disclosure. FIG. 3 is described in the context of system 100 of FIG. 1.

In operation, responsive to an overvoltage condition at device 100 (300, YES branch), overvoltage detector 112 may conduct a current through a current path formed by a series connection between a fuse and a Zener diode of overvoltage detector 112 (310). For example, if device 110 experiences an overvoltage condition during which a voltage across terminals 118B and 118C exceeds the breakdown voltage $V_Z$ of Zener diode 114, Zener diode 114 may conduct a current through its conduction path and on to fuse 116.

Alternatively responsive to no overvoltage condition at device 100 (300, NO branch), overvoltage detector 112 may refrain from conducting the current through the current path formed by the series connection between the fuse and the Zener diode of overvoltage detector 112 (330). For example, if device 110 if the voltage across terminals 118B and 118C does not exceed the breakdown voltage $V_Z$ of Zener diode 114, Zener diode 114 may not conduct any current through its conduction path and therefore prevent fuse 116 from conducting any current.

Responsive to conducting the current through the current path, overvoltage detector 112 may break the current path (320). For example, in response to receiving a current from Zener diode 114 after Zener diode 114 begins conducting due to the overvoltage condition at terminals 118E and 118C of device 110, fuse 116 may heat up and burn until the conduction path running through fuse 116 breaks and causes overvoltage detector 112 to cease conducting. The break in fuse 116 may be visible later during a visual inspection of device 110 (e.g., under X-ray).

Figure 4A:
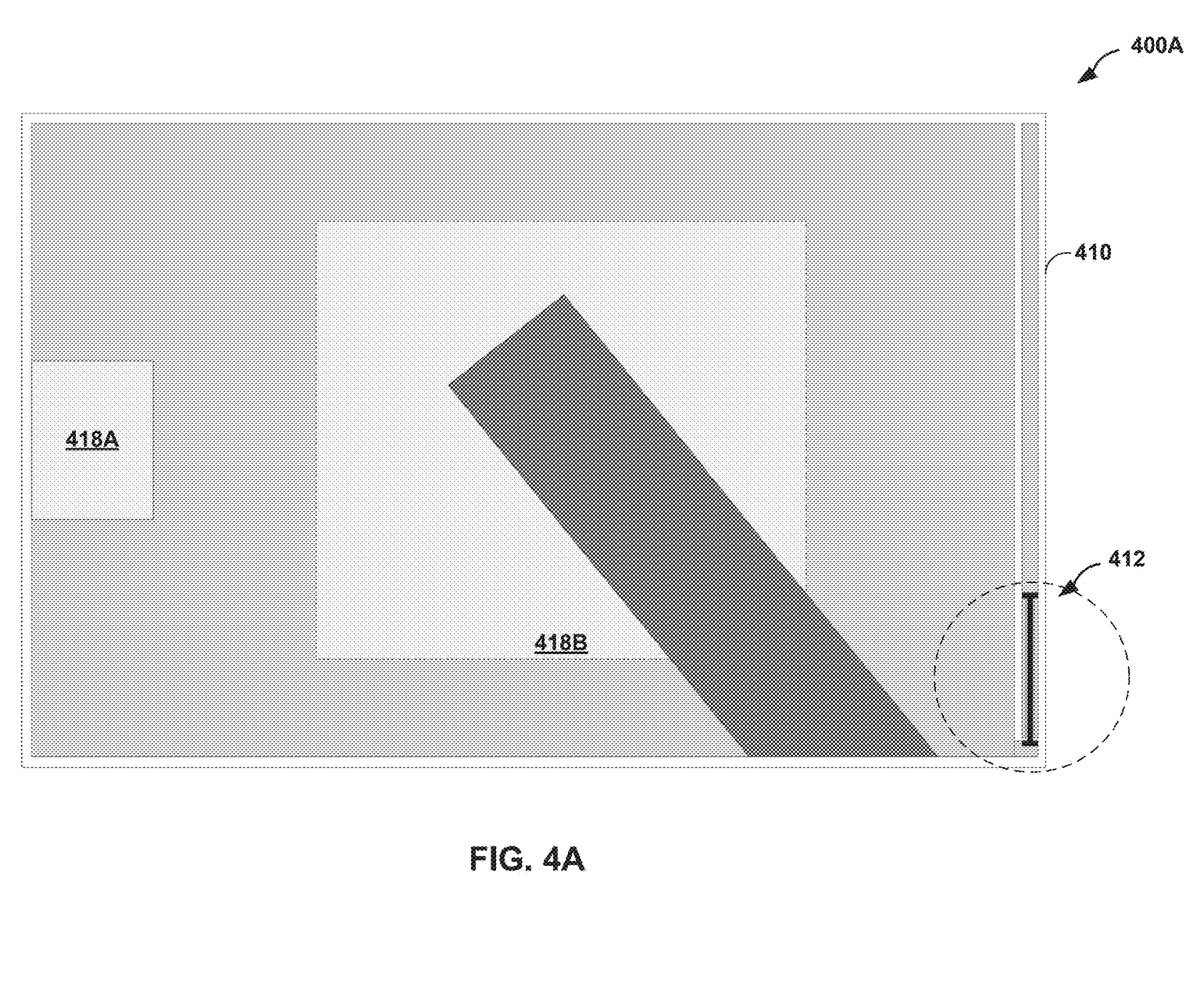
FIGS. 4A-4C are conceptual diagrams illustrating different overvoltage detection systems configured to permanently change states when an overvoltage event occurs, in accordance with one or more aspects of the present disclosure.
Figure 4B:
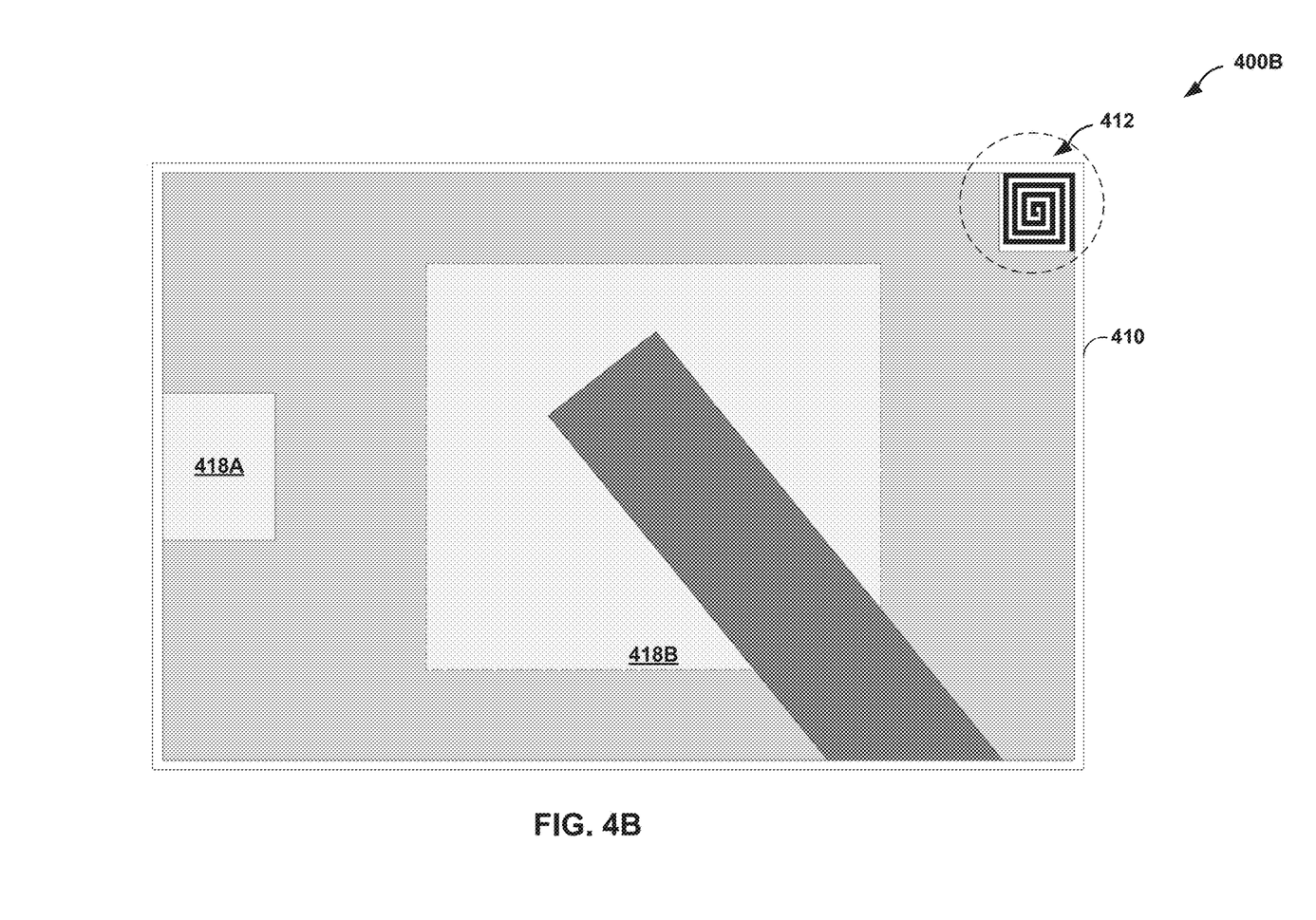
Figure 4C:
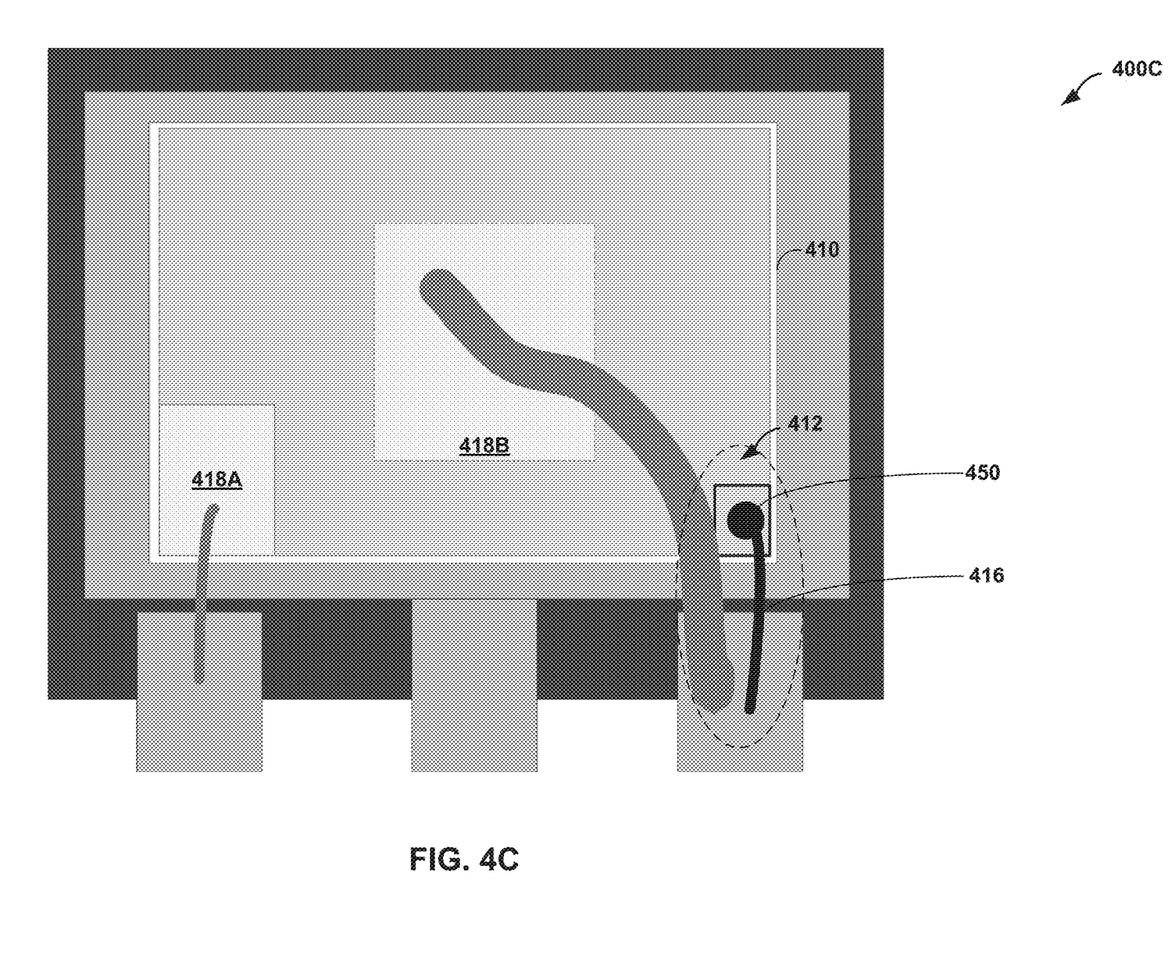

FIGS. 4A-4C are conceptual diagrams illustrating different overvoltage detection systems configured to permanently change states when an overvoltage event occurs, in accordance with one or more aspects of the present disclosure. FIGS. 4A-4C are described in the context of system 100 of FIG. 1.

Each of FIGS. 4A-4C shows a top-down view of one of systems 400A-400C (collectively "systems 400") as a different example of system 100. In each of systems 400A-400C, transistor device 410 includes gate terminal 418 and source terminal 418B. Each of systems 400A-400C also includes drain terminal 418C that is not shown. Also in each of systems 400, at least a portion of overvoltage detection structure 412 is integrated onto the same die as transistor device 410.

In addition, in each of the examples of system. 400, a semiconductor die includes both transistor device 410 and a Zener diode of overvoltage detection structure 412 which represents the portion of overvoltage detector 412. In systems 400A and 400B, the semiconductor die further includes the fuse of overvoltage detection structure 412.

In the example of systems 400A and 400B, at least a portion of overvoltage detection structure 412 is implemented on the same semiconductor die as transistor device 410. Overcurrent detection structure 412 may be implemented without a production technology change and with only a device layout modification.

Systems 400A may include overvoltage detection structure 412 which includes a Zener diode having the same breakdown voltage $V_Z$ of transistor device 410 and in system 400A, overvoltage detection structure 412 is obtained from a slice or piece of the die that is isolated from gate 418A and source 418B of transistor device 410. In some examples, system 400A does not include gate 418A. The fuse of overvoltage detection structure 412 is connected between source 418B of transistor device 410 and the isolated source of the Zener diode of overvoltage detection structure 412. In some examples, the fuse of overvoltage detection structure 412 could be connected on the opposite side of the die with drain 418C and in that case, the drain of the Zener diode of overvoltage detection structure 412 may be may be isolated instead of the source of the Zener diode of overvoltage detection structure 412 may be and the fuse of overvoltage detection structure 412 may be connected in between.

In the example of system 400A, overvoltage detector 412 is located on the die in a similar thermal position as device 410 so as to experience approximately the same operational temperatures as device 410 and therefore undergo similar wearing out of its respective breakdown voltage $V_Z$. In the example of system 400B, overvoltage detector 412 is located on an edge or in the corner of the semiconductor die as opposed to being located on the die in a similar thermal position as device 410.

In the example of system 400C, the Zener diode of overvoltage detector 412 may be located on the semiconductor die with device 410 however the fuse of overvoltage detector 412 may be an external wire made from x-Ray visible material or material that is visible under other light spectrum that is different from the light spectrum in which other components of systems 400 are visible. For instance, the semiconductor die in system 400C does not include fuse 416 which is the fuse of overvoltage detection structure 412, rather, the Zener diode of overvoltage detection structure 412 includes terminal 450 which is configured to electrically couple the semiconductor die to fuse 416 of overvoltage detection structure 412 (fuse 416 is shown in FIG. 4C as being a wire that is external to the semiconductor die).

Figure 5:
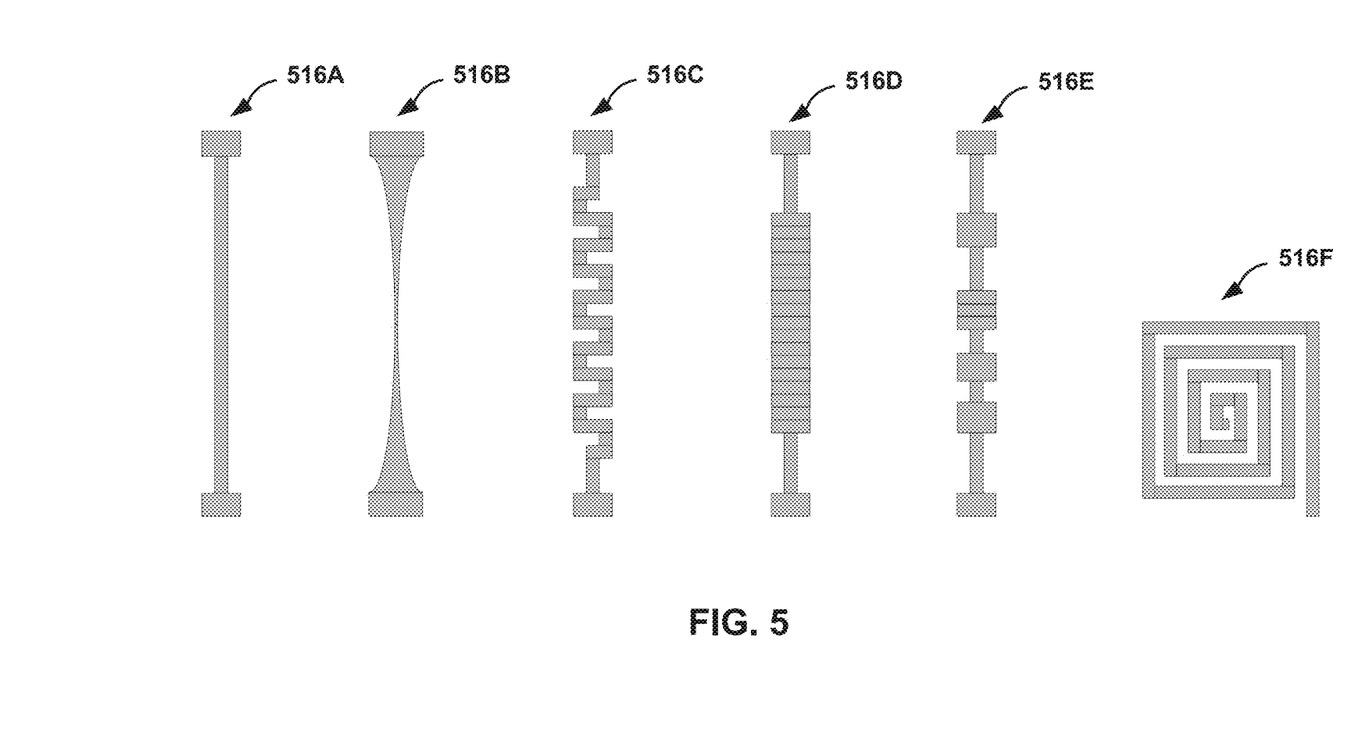
FIG. 5 is a conceptual diagram illustrating different example fuses of art example overvoltage detection system configured to permanently change states when an overvoltage event occurs, in accordance with one or more aspects of the present disclosure.

FIG. 5 is a conceptual diagram illustrating different example fuses of an example overvoltage detection system configured to permanently change states when an overvoltage event occurs, in accordance with one or more aspects of the present disclosure. FIG. 5 is described below in the context of system 100 of FIG. 1.

FIG. 5 shows example fuses 516A-516F (collectively "fuses 516") as examples of fuse 116 of FIG. 1. Fuses 516 can be made of different materials that are visible at x-Ray. In some examples, fuses 516 may be made from normally high density metals such as copper, tungsten, silver, gold, zinc, tin or metals alloys. In other words, to more easily detect a break in one of fuses 516, fuses 516 may be made from a material that reflects X-ray light. Therefore, to inspect a potentially failed or defective device for overvoltage damage, a device, such as device 110, can be x-rayed and whether or not fuse 516 broke, and therefore whether or not device 110 experienced an overvoltage condition, can be quickly and easily determined from the x-ray.

Fuses 516 may have a resistance sufficient to cause the fuse to burn from the current being conducted by Zener diode 114. The resistance of fuses 516 may depend. on the material, the area, and/or the shape of that fuse 516. To achieve the resistance that is sufficient to cause the fuse to burn due to the current being conducted by the Zener diode, each fuse 516 may include a particular material, a particular shape, or a particular area. For example, even if fuses 516 are all made from the same material, each of fuses 516B-516F may have a slightly different resistance due to their respective shapes, and therefore be able to withstand or not withstand different levels of current before burning and breaking. Likewise, two different fuses of the shape of fuse 516A may have different resistances that depend on the material used and/or the size or area of the fuse. Each fuse 516 is in parallel to the device to check $W=V^2/R$ therefore, the resistance of each of fuses 516 has to be sufficiently "small" to burn the fuse.

Clause 1. A semiconductor component comprising: a device; and an overvoltage detection structure that includes a current path comprising a Zener diode connected in series with a fuse, wherein: the Zener diode is configured to conduct a current in response to an overvoltage condition at the device; and the fuse is configured to break the current path of the overvoltage detection structure in response to the Zener diode conducting the current.

Clause 2. The semiconductor component of clause 1, wherein the fuse comprises a resistance sufficient to cause the fuse to burn from the current being conducted by the Zener diode.

Clause 3. The semiconductor component of clause 2, wherein to achieve the resistance that is sufficient to cause the fuse to burn due to the current being conducted by the Zener diode, the fuse comprises at least one of a particular material, a particular shape, or a particular area.

Clause 4. The semiconductor component of any one of clauses 1-3, wherein the fuse comprises a material that reflects X-ray light.

Clause 5. The semiconductor component of any one of clauses 1-4, wherein the fuse burning changes at least one of the particular material, the particular shape, or the particular area.

Clause 6. The semiconductor component of any one of clauses 1-5, wherein the fuse burning changes the reflection behavior of the material that reflects X-ray light.

Clause 7. The semiconductor component of any one of clauses 1-6, wherein: a first terminal of the overvoltage detection structure is coupled to a drain of the device and a second terminal of the overvoltage detection structure is coupled to a source of the device; the first terminal of the overvoltage detection structure is coupled to an emitter of the device and the second terminal of the overvoltage detection structure is coupled to a collector of the device; or the first terminal of the overvoltage detection structure is coupled to an anode of the device and the second terminal of the overvoltage detection structure is coupled to a cathode of the device.

Clause 8. The semiconductor component of clause 7, wherein: the first terminal of the overvoltage detection structure is coupled to the Zener diode and the second terminal of the overvoltage detection structure is coupled to the fuse.

Clause 9. The semiconductor component of clause 7, wherein: the first terminal of the overvoltage detection structure is coupled to the fuse and the second terminal of the overvoltage detection structure is coupled to the Zener diode.

Clause 10. A semiconductor die comprising: a transistor device; and at least a portion of an overvoltage detection structure that includes a current path comprising a Zener diode connected in series with a fuse, wherein: the Zener diode is configured to conduct a current in response to an overvoltage condition at the device; and the fuse is configured to break the current path of the overvoltage detection structure in response to the Zener diode conducting the current.

Clause 11. The semiconductor die of clause 10, wherein the semiconductor die includes the transistor device and the Zener diode of the overvoltage detection structure.

Clause 12. The semiconductor die of clause 11, wherein the semiconductor die further includes the fuse of the overvoltage detection structure.

Clause 13. The semiconductor die of clause 11, wherein the semiconductor die does not include the fuse of the overvoltage detection structure.

Clause 14. The semiconductor die of clause 13, wherein the Zener diode of the overvoltage detection structure includes a terminal configured to electrically couple the semiconductor die to the fuse of the overvoltage detection structure.

Clause 15. A method comprising: responsive to an overvoltage condition at a device, conducting, by a Zener diode of an overvoltage detection structure, a current through a current path formed by a series connection between a fuse and the Zener diode of the overvoltage detection structure; and responsive to conducting the current through the current path, breaking, by the fuse of the overvoltage detection structure, the current path.

Clause 16. The method of clause 15 further comprising: refraining from conducting, by the Zener diode, the current through the current path in response to a lack of an overvoltage condition at the device.

Clause 17. The method of any one of clauses 15 or 16, wherein the Zener diode is formed on a semiconductor die that includes the device.

Clause 18. The method of clause 17, wherein: the fuse is formed on the semiconductor die that includes the device; or the fuse is external to the semiconductor die that includes the device and the fuse comprises a wire that electrically couples a terminal of the Zener diode to a terminal of the device.

Clause 19. The method of any one of clauses 15-18, wherein the fuse comprises a material that has resistance sufficient to cause the fuse to burn from the current being conducted by the Zener diode, that material being reflective of X-ray light.

Clause 20. The method of any one of clauses 15-19, wherein the fuse comprises at least one of a particular material, a particular shape, or a particular area.

Various embodiments of the invention have been described. These and other embodiments are within the scope of the following claims.

What is claimed is:

1. A semiconductor component comprising:
   a device; and
   an overvoltage detection structure that includes a current path comprising a Zener diode connected in series with a fuse,
   wherein the Zener diode is configured to conduct a current in response to an overvoltage condition at the device,
   wherein the fuse is configured to break the current path of the overvoltage detection structure in response to the Zener diode conducting the current,
   wherein the device and the Zener diode are formed on a same semiconductor die and each comprise a terminal, and
   wherein the fuse is external to the semiconductor die and comprises a wire that is connected to the terminal of the Zener diode and electrically couples the terminal of the Zener diode to the terminal of the device.

2. The semiconductor component of claim 1, wherein the fuse comprises a resistance sufficient to cause the fuse to burn from the current being conducted by the Zener diode.

3. The semiconductor component of claim 2, wherein to achieve the resistance that is sufficient to cause the fuse to burn due to the current being conducted by the Zener diode, the fuse comprises at least one of a particular material, a particular shape, or a particular area.

4. The semiconductor component of claim 3, wherein the fuse comprises a material that reflects X-ray light.

5. The semiconductor component of claim 3, wherein the fuse burning changes at least one of the particular material, the particular shape, or the particular area.

6. The semiconductor component of claim 4, wherein the fuse burning changes the reflection behavior of the material that reflects X-ray light.

7. The semiconductor component of claim 1, wherein:
   a first terminal of the overvoltage detection structure is coupled to a drain of the device and a second terminal of the overvoltage detection structure is coupled to a source of the device; or
   the first terminal of the overvoltage detection structure is coupled to an emitter of the device and the second terminal of the overvoltage detection structure is coupled to a collector of the device; or
   the first terminal of the overvoltage detection structure is coupled to an anode of the device and the second terminal of the overvoltage detection structure is coupled to a cathode of the device.

8. The semiconductor component of claim 7, wherein the first terminal of the overvoltage detection structure is coupled to the Zener diode and the second terminal of the overvoltage detection structure is coupled to the fuse.

9. The semiconductor component of claim 7, wherein the first terminal of the overvoltage detection structure is coupled to the fuse and the second terminal of the overvoltage detection structure is coupled to the Zener diode.

10. The semiconductor component of claim 1, wherein the device comprises a power metal-oxide-semiconductor field-effect transistor or an insulated-gate bipolar transistor.

11. The semiconductor component of claim 1, wherein the fuse comprises one or more metals alloys.

12. The semiconductor component of claim 1, wherein the fuse comprises a material selected from a group consisting of: copper, tungsten, silver, gold, zinc, and tin.

13. The semiconductor component of claim 1,
wherein a breakdown voltage of the Zener diode is greater than a breakdown voltage of the device, and
wherein the fuse is configured to break and store an indication of a voltage overstress event when the Zener diode conducts current in avalanche mode that exceeds the current rating of the device.

14. A semiconductor die comprising:
a device; and
at least a portion of an overvoltage detection structure that includes a current path comprising a Zener diode connected in series with a fuse,
wherein the Zener diode is configured to conduct a current in response to an overvoltage condition at the device,
wherein the fuse is configured to break the current path of the overvoltage detection structure in response to the Zener diode conducting the current,
wherein the device and the Zener diode are formed on the semiconductor die and each comprise a terminal, and
wherein the fuse is external to the semiconductor die and comprises a wire that is connected to the terminal of the Zener diode and electrically couples the terminal of the Zener diode to the terminal of the device.

15. A method comprising:
responsive to an overvoltage condition at a device, conducting, by a Zener diode of an overvoltage detection structure, a current through a current path formed by a series connection between a fuse and the Zener diode of the overvoltage detection structure; and
responsive to conducting the current through the current path, breaking, by the fuse of the overvoltage detection structure, the current path,
wherein the Zener diode is formed on a semiconductor die that includes the device, and
wherein the fuse is external to the semiconductor die that includes the device and the fuse comprises a wire that electrically couples a terminal of the Zener diode to a terminal of the device.

16. The method of claim 15 further comprising refraining from conducting, by the Zener diode, the current through the current path in response to a lack of an overvoltage condition at the device.

17. The method of claim 15, wherein the fuse comprises a material that has resistance sufficient to cause the fuse to burn from the current being conducted by the Zener diode, the material being reflective of X-ray light.

18. The method of claim 15, wherein the fuse comprises at least one of a particular material, a particular shape, or a particular area.

19. The method of claim 15, wherein the device comprises a power metal-oxide-semiconductor field-effect transistor or an insulated-gate bipolar transistor.

20. The method of claim 15,
wherein a breakdown voltage of the Zener diode is greater than a breakdown voltage of the device, and
wherein the fuse is configured to break and store an indication of a voltage overstress event when the Zener diode conducts current in avalanche mode that exceeds the current rating of the device.

* * * * *